(12) United States Patent
Chan (10) Patent No.: US 11,251,250 B2
(45) Date of Patent: Feb. 15, 2022

(54) DISPLAY SUBSTRATE AND DISPLAY DEVICE EACH INCLUDING BLOCKING PART

(71) Applicant: BOE TECHNOLOGY GROUP CO., LTD., Beijing (CN)

(72) Inventor: Yu Cheng Chan, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 74 days.

(21) Appl. No.: 16/634,297

(22) PCT Filed: Jul. 8, 2019

(86) PCT No.: PCT/CN2019/095098
§ 371 (c)(1),
(2) Date: Jan. 27, 2020

(87) PCT Pub. No.: WO2020/057233
PCT Pub. Date: Mar. 26, 2020

(65) Prior Publication Data
US 2021/0143240 A1    May 13, 2021

(30) Foreign Application Priority Data
Sep. 17, 2018  (CN) .......................... 201811080560.7

(51) Int. Cl.
*H01L 27/32* (2006.01)
*H01L 51/52* (2006.01)
(52) U.S. Cl.
CPC ...... *H01L 27/3272* (2013.01); *H01L 27/3246* (2013.01); *H01L 51/5281* (2013.01)

(58) Field of Classification Search
USPC .......................................................... 257/40
See application file for complete search history.

(56) References Cited

U.S. PATENT DOCUMENTS

| 2014/0183479 | A1* | 7/2014 | Park ................... H01L 27/3218 257/40 |
| 2017/0005150 | A1* | 1/2017 | Yeo .................... H01L 27/3262 |
| 2017/0033166 | A1* | 2/2017 | Shim .................. H01L 27/3279 |
| 2019/0103578 | A1  | 4/2019 | Yang et al. |

FOREIGN PATENT DOCUMENTS

| CN | 107369700 A | 11/2017 |
| CN | 107611146 A | 1/2018 |
| CN | 109216585 A | 9/2018 |
| CN | 108648634 A | 10/2018 |
| KR | 20150101414 A | 9/2015 |

* cited by examiner

*Primary Examiner* — Nduka E Ojeh
(74) *Attorney, Agent, or Firm* — Dilworth & Barrese, LLP.; Michael J. Musella, Esq.

(57) ABSTRACT

A display substrate and a display device are provided. The display substrate includes a base substrate; a first electrode, located on the base substrate; a second electrode, located on the base substrate, an orthographic projection of the second electrode on the base substrate being adjacent to an orthographic projection of the first electrode on the base substrate; and a conductive layer, including a blocking part between opposite side surfaces of the first electrode and the second electrode, the conductive layer being grounded, and every two selected from the group consisting of the first electrode, the second electrode, and the conductive layer being insulated from each other.

19 Claims, 7 Drawing Sheets

DISPLAY SUBSTRATE AND DISPLAY DEVICE EACH INCLUDING BLOCKING PART

CROSS-REFERENCE TO RELATED APPLICATIONS

The application claims priority of the Chinese patent application No. 201811080560.7, filed on Sep. 17, 2018, the entire disclosure of which is incorporated herein by reference as part of the present application.

TECHNICAL FIELD

At least one embodiment of the present disclosure relates to a display substrate and a display device.

BACKGROUND

Organic Light-Emitting Diode (OLED) devices have the advantages of self-luminous, fast response, wide viewing angle, high brightness, colorful, thin and light etc., compared to Liquid Crystal Displays (LCD), and are considered as the next generation of the display technology.

With the continuous development of the display technology, the resolution of OLED is getting higher and higher.

SUMMARY

At least one embodiment of the present disclosure relates to a display substrate and a display device to alleviate a crosstalk problem.

At least one embodiment of the present disclosure provides a display substrate, which includes: a base substrate, a first electrode located on the base substrate; a second electrode located on the base substrate, and a conductive layer; an orthographic projection of the second electrode on the base substrate is adjacent to an orthographic projection of the first electrode on the base substrate; the conductive layer includes a blocking part between opposite side surfaces of the first electrode and the second electrode; the conductive layer is grounded, and every two selected from the group consisting of the first electrode, the second electrode, and the conductive layer are insulated from each other.

In one or more embodiments, an orthographic projection of the conductive layer on the base substrate is not overlapped with the orthographic projection of the first electrode on the base substrate and is not overlapped with the orthographic projection of the second electrode on the base substrate.

In one or more embodiments, an orthographic projection of the conductive layer on the base substrate surrounds both of the orthographic projection of the first electrode on the base substrate and the orthographic projection of the second electrode on the base substrate.

In one or more embodiments, the conductive layer includes a first hollowed-out part and a second hollowed-out part which are adjacent to each other, and the orthographic projection of the first electrode on the base substrate is located within an orthographic projection of the first hollowed-out part on the base substrate, and the orthographic projection of the second electrode on the base substrate is located within an orthographic projection of the second hollowed-out part on the base substrate.

In one or more embodiments, the display substrate further includes an insulation material layer, the insulation material layer is filled in a space between the opposite side surfaces of the first electrode and the second electrode, the blocking part runs through the insulation material layer, and the insulation material layer is in contact with the opposite side surfaces of the first electrode and the second electrode.

In one or more embodiments, the conductive layer is constituted by the blocking portion, and the blocking part protrudes from the insulation material layer in a direction away from the base substrate.

In one or more embodiments, the conductive layer is constituted by the blocking part, and a surface of the blocking part away from the base substrate is flush with a surface of the insulation material layer away from the base substrate.

In one or more embodiments, the conductive layer further includes an intersected part that is intersected with the blocking part at a side of the insulation material layer away from the base substrate.

In one or more embodiments, the blocking part and the intersected part form a T-shaped structure.

In one or more embodiments, the blocking part and the intersected part constitute an integral structure.

In one or more embodiments, the display substrate further includes an interlayer insulation layer, the interlayer insulation layer is located at a side of the first electrode close to the base substrate, the first electrode includes a first main part located at a side of the interlayer insulation layer away from the base substrate and a first connection part running through the interlayer insulation layer; the interlayer insulation layer is located at a side of the second electrode close to the base substrate, and the second electrode includes a second main part at the side of the interlayer insulation layer away from the base substrate and a second connection part running through the interlayer insulation layer.

In one or more embodiments, a size of the first main part in a direction perpendicular to the base substrate is less than a size of the conductive layer in the direction perpendicular to the base substrate; a size of the second main part in the direction perpendicular to the base substrate is less than a size of the conductive layer in the direction perpendicular to the base substrate.

In one or more embodiments, a size of the insulation material layer in the direction perpendicular to the base substrate is greater than a size of at least one of the first main part or the second main part in the direction perpendicular to the base substrate.

In one or more embodiments, the display substrate further includes a source-drain electrode layer between the base substrate and the interlayer insulation layer, the source-drain electrode layer includes a first drain electrode electrically connected with the first connection part, a second drain electrode electrically connected with the second connection part, and a conductive wire electrically connected with the conductive layer; the blocking part further runs through the interlayer insulation layer and is electrically connected with the conductive wire, and the conductive layer is grounded by the conductive wire.

In one or more embodiments, every two of the first drain electrode, the second drain electrode, and the conductive wire are insulated from each other.

In one or more embodiments, a material of the conductive layer includes a light-shielding material.

In one or more embodiments, both of the first electrode and the second electrode are pixel electrodes.

In one or more embodiments, the first electrode and the second electrode are connected with the first drain electrode and the second drain electrode, respectively.

At least one embodiment of the present disclosure further provides a display device including any one of the above display substrates.

BRIEF DESCRIPTION OF THE DRAWINGS

In order to clearly illustrate the technical solution of the embodiments of the present disclosure, the drawings of the embodiments will be briefly described in the following. It is obvious that the described drawings are only related to some embodiments of the present disclosure and thus are not limitative of the present disclosure.

DETAILED DESCRIPTION

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms "comprise" or "include" are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and in the case that the position of the described object is changed, the relative position relationship may be changed accordingly.

As the resolution of OLEDs is getting higher and higher, a parasitic capacitance is easily generated between adjacent pixels, thereby causing a crosstalk problem.

For example, in a silicon-based micro OLED display device, an ultra-high pixel density (Pixels Per Inch, PPI) design may be adopted. For example, the PPI may be greater than or equal to 3000. In a display device with an ultra-high PPI, the crosstalk problem can be caused by the capacitive coupling effect because a space between two adjacent pixel electrodes is too small. For example, the pixel electrode may be an anode of an OLED, without limited thereto.

Figure 1:
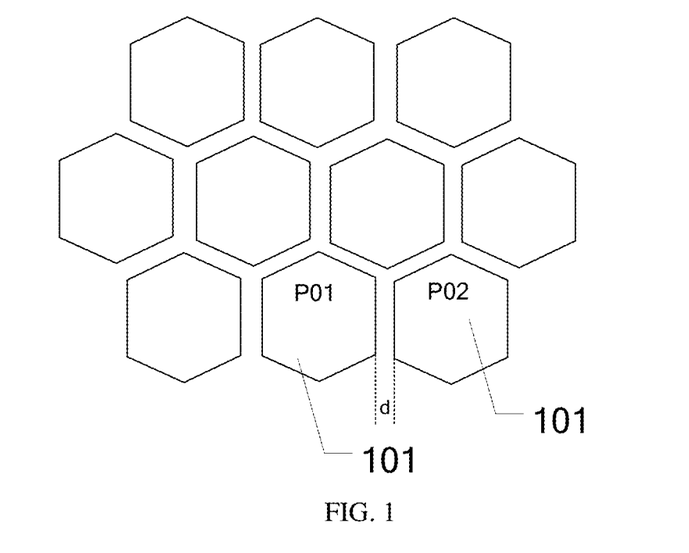
FIG. 1 is a schematic plan view illustrating a pixel electrode of a display device.

FIG. 1 is a schematic plan view illustrating a pixel electrode of a display device. FIG. 1 illustrates a plurality of pixel electrodes 101 insulated from each other, and each pixel electrode 101 is separately applied with a signal to control a corresponding pixel to be turned on (to emit light) and turned off (not to emit light). For example, a distance d between adjacent pixel electrodes 101 may be less than 1 μm. For example, a space between adjacent pixel electrodes 101 is 0.85 μm. Each pixel electrode 101 may correspond to one pixel. If a case requires the pixel P01 is turned on, and the pixel P02 should be completely turned off, however, the pixel P02 is coupled to emit light thereby causing a crosstalk problem due to a parasitic capacitance generated between adjacent pixel electrodes 101 in a case where a space between the pixel P01 and the pixel P02 is small.

Figure 2:
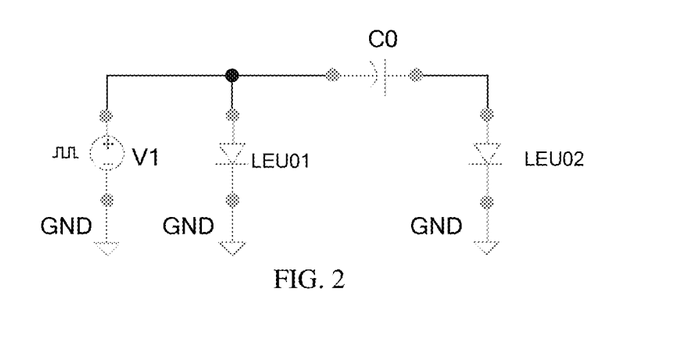
FIG. 2 is a schematic diagram illustrating a parasitic capacitance between adjacent pixels of a display device.

FIG. 2 is a schematic diagram illustrating a parasitic capacitance between adjacent pixels of a display device. With reference to FIG. 1 and FIG. 2, a pixel P01 includes a light-emitting unit LEU01, and a pixel P02 includes a light-emitting unit LEU02. A parasitic capacitance CO is generated between a pixel electrode of the light-emitting unit LEU02 and a pixel electrode of the light-emitting unit LEU01. In the case where the light-emitting unit LEU01 emits light, and the light-emitting unit LEU02 is turned off and does not emit light, when a signal V1 is applied to the light-emitting unit LEU01 and the light-emitting unit LEU01 is turned on, the parasitic capacitance CO causes the light-emitting unit LEU02 to be coupled to emit light, which causes a crosstalk problem. The light-emitting unit LEU01 and the light-emitting unit LEU02 may be OLEDs. In the drawings of the embodiments of the present disclosure, GND refers to being grounded. For example, an anode of the OLED is a pixel electrode, and a cathode of the OLED is grounded.

Figure 3:
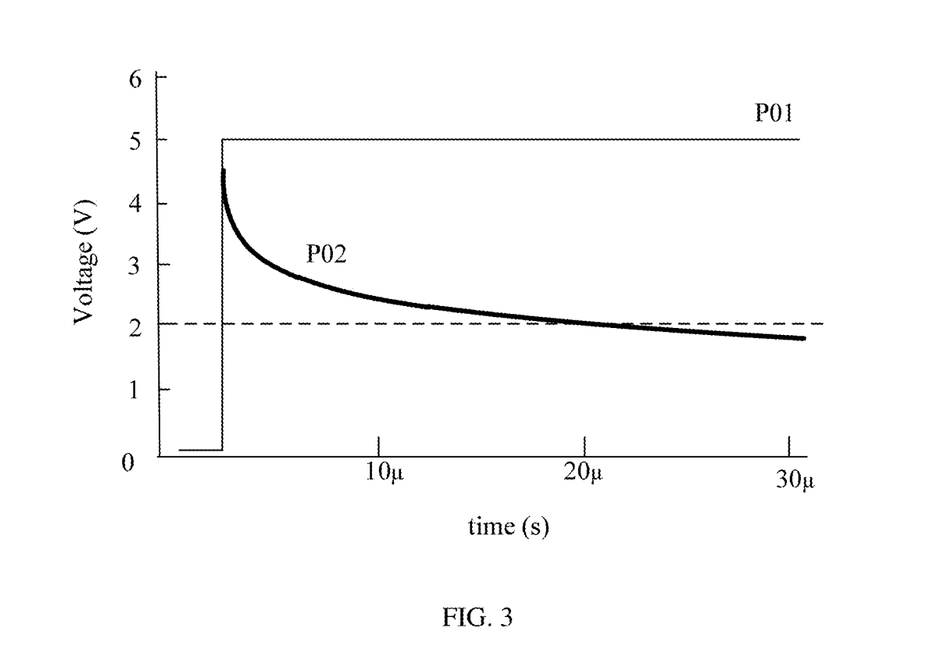
FIG. 3 is a schematic diagram illustrating an adjacent pixel being coupled to emit light by a parasitic capacitance of a display device.

FIG. 3 is a schematic diagram illustrating an adjacent pixel being coupled to emit light by a parasitic capacitance of a display device. A thin solid line of FIG. 3 refers to a voltage of the pixel electrode of the pixel P01, and a thick solid line of FIG. 3 refers to a coupling voltage of the pixel electrode of the pixel P02. In the case where a turn-on voltage of the light-emitting unit LEU02 (a voltage of the pixel electrode) is greater than or equal to 2V, when the pixel P01 is in a light-emitting state, the coupling voltage of the pixel electrode of the pixel P02 is greater than the turn-on voltage of the light-emitting unit LEU02, so that the pixel P02 can emit light due to the effect of the coupling voltage.

At least one embodiment of the present disclosure provides a display substrate and a display device to alleviate a crosstalk problem.

Figure 4:
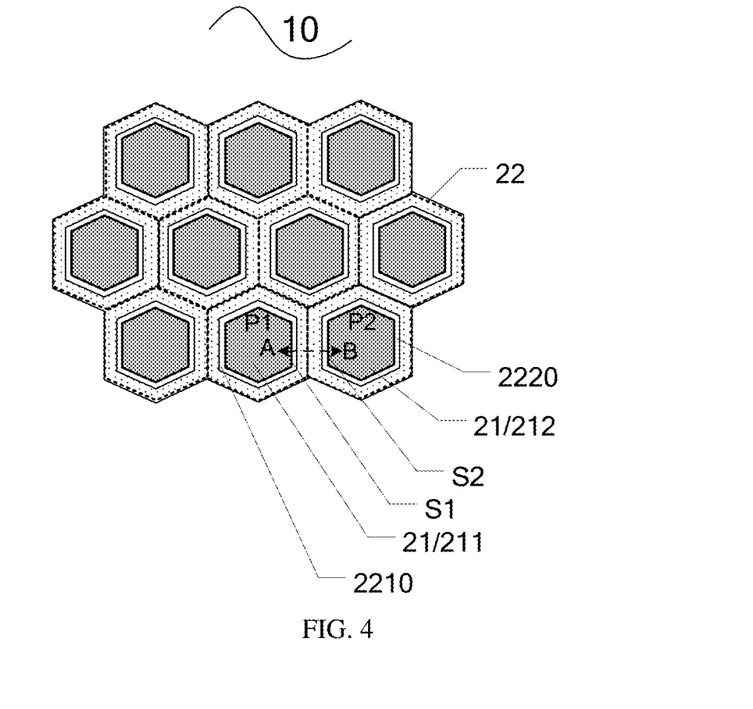
FIG. 4 is a plan view illustrating a display substrate provided by one or more embodiments of the present disclosure.
Figure 5:
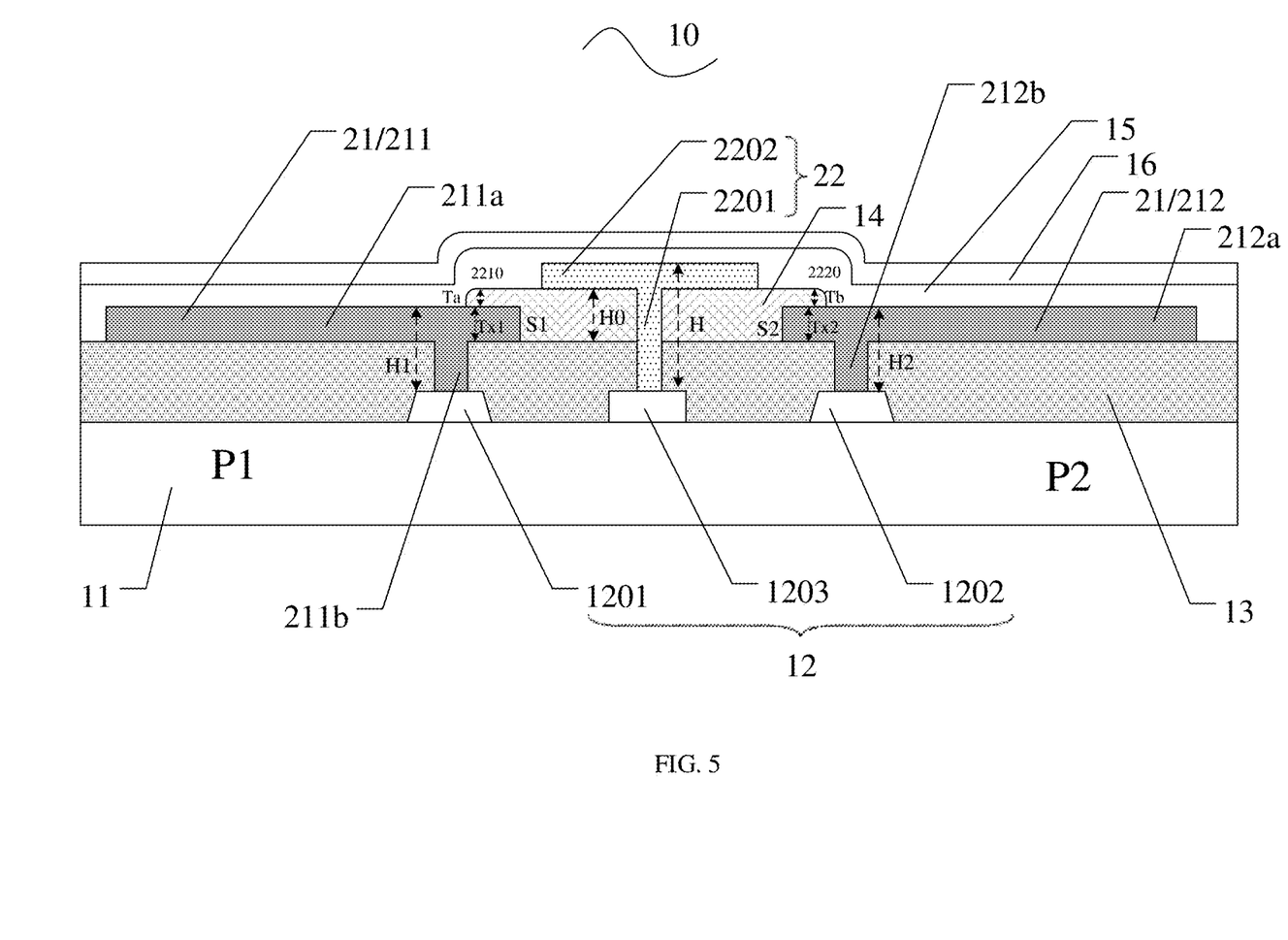
FIG. 5 is a cross-sectional view illustrating a display substrate provided by one or more embodiments of the present disclosure.

FIG. 4 and FIG. 5 are a plan view and a cross-sectional view illustrating a display substrate 10 provided by one or more embodiments of the present disclosure, respectively. FIG. 5 can be a cross-sectional view at A-B of FIG. 4. Of course, the plan view illustrating the cross-sectional view illustrated in FIG. 5 can also adopt other forms, and it is not limited to that as illustrated in FIG. 4. The cross-sectional view at A-B of the plan view as illustrated in FIG. 4 can also adopt other forms, and it is not limited to that as illustrated in FIG. 5.

As illustrated in FIG. 4 and FIG. 5, the display substrate 10 provided by one or more embodiments of the present disclosure includes a base substrate 11, a first electrode 211, a second electrode 212, and a conductive layer 22. The first electrode 211 is located on the base substrate 11. The second electrode 212 is located on the base substrate 11. An orthographic projection of the second electrode 212 on the base substrate 11 is adjacent to an orthographic projection of the first electrode 211 on the base substrate 11. The conductive layer 22 includes a blocking part 2201 between a side surface S1 of the first electrode 211 and a side surface S2 of the second electrode 212, the side surface S1 and the side surface S2 are opposite to each other. The conductive layer 22 is grounded. Every two selected from the group consisting of the first electrode 211, the second electrode 212, and the conductive layer 22 are insulated from each other. For example, the first electrode 211 and the second electrode 212 are adjacent to each other. For example, both of the first electrode and the second electrode are pixel electrodes.

As illustrated in FIG. 4 and FIG. 5, the pixel P1 and the pixel P2 are adjacent to each other. The pixel P1 includes a first electrode 211 and the pixel P2 includes a second electrode 212.

According to a display substrate provided by one or more embodiments of the present disclosure, the grounded conductive layer 22 is provided between the first electrode 211 and the second electrode 212. The conductive layer 22 includes the blocking part 2201 between the side surface S1 of the first electrode 211 and the side surface S2 of the second electrode 212, and the side surface S1 and the side surface S2 are opposite to each other. The blocking part 2201 can shield signals, which can facilitate to alleviate the crosstalk problem caused by the coupling capacitance, so as to prevent the first electrode 211 and second electrode 212 that are adjacent to each other from affecting each other, and alleviate or eliminate an image crosstalk problem caused by the coupling capacitance between adjacent pixels.

For example, "every two selected from the group consisting of the first electrode 211, the second electrode 212, and the conductive layer 22 are insulated from each other" refers to that every two of them are insulated from each other. For example, the first electrode 211 and the second electrode 212 are insulated from each other, the second electrode 212 and the conductive layer 22 are insulated from each other, and the first electrode 211 and the conductive layer 22 are insulated from each other. Every two of them being insulated from each other can be achieved by being spaced apart, or by providing an insulation layer between them.

As illustrated in FIG. 4 and FIG. 5, the side surface S1 of the first electrode 211 is opposite to the side surface S2 of the second electrode 212. The side surface S1 and S2 face each other.

For example, both of the first electrode 211 and the second electrode 212 are pixel electrodes.

For example, the first electrode 211 and the second electrode 212 may be located in a same electrode layer 21. For example, the first electrode 211 and the second electrode 212 may be formed from a same film layer by using a same patterning process. For example, the first electrode 211 and the second electrode 212 may be formed by using a same conductive material. For example, a material of the first electrode 211 and the second electrode 212 may be at least one selected from the group consisting of a metal and a conductive metal oxide. For example, the conductive metal oxide may include Indium Tin Oxide (ITO), without limited thereto.

As illustrated in FIG. 4 and FIG. 5, in one or more embodiments, in order to further avoid the generation of the coupling capacitance, an orthographic projection of the conductive layer 22 on the base substrate 11 is not overlapped with the orthographic projection of the first electrode 211 and is not overlapped with the orthographic projection of the second electrode 212 on the base substrate 11.

As illustrated in FIG. 4 and FIG. 5, in one or more embodiments, in order to achieve a better shielding effect, the orthographic projection of the conductive layer 22 on the base substrate 11 surrounds both of the orthographic projection of the first electrode 211 on the base substrate 11 and the orthographic projection of the second electrode 212 on the base substrate 11.

As illustrated in FIG. 4 and FIG. 5, in one or more embodiments, the conductive layer 22 includes a first hollowed-out part 2210 and a second hollowed-out part 2220 which are adjacent to each other, the orthographic projection of the first electrode 211 on the base substrate 11 is located within an orthographic projection of the first hollowed-out part 2210 on the base substrate 11, and the orthographic projection of the second electrode 212 on the base substrate 11 is located within an orthographic projection of the second hollowed-out part 2220 on the base substrate 11. For example, different pixel electrodes are surrounded by the hollowed-out parts of the conductive layer 22 which is formed of an integral structure, so that all pixel electrodes may be shielded by the conductive layer 22 to avoid the crosstalk of adjacent pixel electrodes caused by the coupling capacitance. The dotted lines of FIG. 4 are provided to distinguish different pixels, and are not a portion of the display substrate.

As illustrated in FIG. 5, in one or more embodiments, the display substrate 10 further includes an insulation material layer 14, and a space between the opposite side surfaces S1 and S2 of the first electrode 211 and the second electrode 212 is filled with the insulation material layer 14. The blocking part 2201 runs through the insulation material layer 14, and the insulation material layer 14 is in contact with the opposite side surfaces S1 and S2 of the first electrode 211 and the second electrode 212. As illustrated in FIG. 5, the insulation material layer 14 is in contact with the side surface S1 of the first electrode 211 and is in contact with the side surface S2 of the second electrode 212. For example, the insulation material layer 14 may be made of at least one selected from the group consisting of a resin material, silicon nitride, silicon oxide, and ethyl silicate, so as to facilitate forming the insulation layer with a thick thickness, and further reduce the coupling capacitance. In FIG. 5, the blocking part 2201 completely fills a via hole of the insulation material layer 14, but the structure of the blocking part 2201 is not limited to that as illustrated in FIG. 5, as long as it is located between the opposite side surfaces S1 and S2 of the first electrode 211 and the second electrode 212, and may have a function of shielding. For example, the blocking part 2201 may not completely fill the via hole of the insulation material layer 14, but extends along a sidewall of the via hole of the insulation material layer and has a height not greater than a height of the sidewall.

As illustrated in FIG. 5, in one or more embodiments, the conductive layer 22 further includes an intersected part 2202 that is intersected with the blocking part 2201 and is located at a side of the insulation material layer 14 away from the base substrate 11. The blocking part 2201 runs through the insulation material layer 14, the intersected part 2202 is located on the insulation material layer 14, and the blocking part 2201 and the intersected part 2202 form a T-shaped structure. As illustrated in FIG. 5, in a direction perpendicular to the base substrate 11, the intersected part 2202 is not overlapped with the first electrode 211, and the intersected part 2202 is not overlapped with the second electrode 212. The shielding effect of the conductive layer can be improved by arranging the intersected part 2202. For example, the intersected part 2202 and the blocking part 2201 are perpendicular to each other, without limited thereto. For example, the blocking part 2201 and the intersected part 2202 are integrally formed and constitute an integral structure, without limited thereto.

As illustrated in FIG. 5, in one or more embodiments, the display substrate 10 further includes an interlayer insulation layer 13. The interlayer insulation layer 13 is located at a side of the first electrode 211 close to the base substrate 11. The first electrode 211 includes a first main part 211a located at a side of the interlayer insulation layer 13 away from the base substrate 11 and a first connection part 211b running through the interlayer insulation layer 13. The interlayer insulation layer 13 is located at a side of the second electrode 212 close to the base substrate 11. The second electrode 212 includes a second main part 212a located at a side of the interlayer insulation layer 13 away from the base substrate 11 and a second connection part 212b running through the interlayer insulation layer 13.

As illustrated in FIG. 5, in one or more embodiments, in order to improve the shielding effect of the conductive layer, a size T×1 of the first main part 211a in a direction perpendicular to the base substrate 11 is less than a size H of the conductive layer 22 in the direction perpendicular to the base substrate 11. A size T×2 of the second main part 212a in the direction perpendicular to the base substrate 11 is less than the size H of the conductive layer 22 in the direction perpendicular to the base substrate 11.

As illustrated in FIG. 5, in order to improve the shielding effect of the conductive layer, a size T×1 of the first main part 211a in a direction perpendicular to the base substrate 11 is less than a size H0 of the insulation material layer 14 in the direction perpendicular to the base substrate 11. A size T×2 of the second main part 212a in the direction perpendicular to the base substrate 11 is less than the size H0 of the insulation material layer 14 in the direction perpendicular to the base substrate 11.

As illustrated in FIG. 5, in order to improve the shielding effect of the conductive layer, a size T×1 of the first main part 211a in a direction perpendicular to the base substrate 11 is less than a size H of the blocking part 2201 in the direction perpendicular to the base substrate 11. A size T×2 of the second main part 212a in the direction perpendicular to the base substrate 11 is less than the size H of the blocking part 2201 in the direction perpendicular to the base substrate 11.

As illustrated in FIG. 5, in one or more embodiments, in order to facilitate the arrangement of the conductive layer and to improve the shielding effect of the conductive layer, a size H0 of the insulation material layer 14 in a direction perpendicular to the base substrate 11 is greater than a size of at least one of the first main part 211a or the second main part 212a in the direction perpendicular to the base substrate 11. The size of the first main part 211a in the direction perpendicular to the base substrate 11 is T×1, and the size of the second main part 212a in the direction perpendicular to the base substrate 11 is T×2. For example, the sizes of the first main part 211a and the second main part 212a in the direction perpendicular to the base substrate 11 are equal.

As illustrated in FIG. 5, in one or more embodiments, the display substrate 10 further includes a source-drain electrode layer 12 between the base substrate 11 and the interlayer insulation layer 13. The source-drain electrode layer 12 includes a first drain electrode 1201 electrically connected with the first connection part 211b, a second drain electrode 1202 electrically connected with the second connection part 212b and a conductive wire 1203 electrically connected with the conductive layer 22. The blocking part 2201 further runs through the interlayer insulation layer 13 and is electrically connected with the conductive wire 1203, and the conductive layer 22 is grounded by the conductive wire 1203. For example, the first drain electrode 1201, the second drain electrode 1202, and the conductive wire 1203 are located in the same layer, and may be formed from a same conductive material layer by a same patterning process. As illustrated in FIG. 5, the blocking part 2201 is in contact with the conductive wire 1203. The embodiment as illustrated in FIG. 5 is described with reference to the case where the conductive layer 22 is grounded by the conductive wire 1203 located in a same layer as the first drain electrode 1201 and the second drain electrode 1202, by way of example, and the conductive layer 22 may also be grounded by other manners, for example, by providing a wiring at an edge. The source-drain electrode layer 12 also includes a source electrode that is not illustrated in figures. For example, every two of the first drain electrode 1201, the second drain electrode 1202, and the conductive wire 1203 are insulated from each other. For example, the first drain electrode 1201 belongs to a first thin film transistor, and the second drain electrode 1202 belongs to a second thin film transistor.

As illustrated in FIG. 5, in one or more embodiments, in order to improve the shielding effect, a size H1 of the first electrode 211 in a direction perpendicular to the substrate 11 is less than a size H of the conductive layer 22 in the direction perpendicular to the substrate 11. A size H2 of the second electrode 212 in the direction perpendicular to the base substrate 11 is less than the size H of the conductive layer 22 in the direction perpendicular to the base substrate 11.

In one or more embodiments, a material of the conductive layer 22 includes a light-shielding material. For example, the light-shielding material includes a metal material. For example, the metal material includes at least one selected from the group consisting of Mo, Cr, Ti, Al, and the like. Because the conductive layer is located between adjacent pixels, the conductive layer 22 is made of the light-shielding material so that the conductive layer can have an effect similar to a black matrix, which is beneficial to improving the display effect.

As illustrated in FIG. 5, in one or more embodiments, a size of a portion of the insulation material layer 14 located on the first electrode 211 in a direction perpendicular to the substrate 11 is Ta, and a size of a portion of the insulation material layer 14 located on the second electrode 212 in the direction perpendicular to the base substrate 11 is Tb. For example, Ta is equal to Tb. In one embodiment, Ta=100 nm, Tb=100 nm, T×1=100 nm, T×2=100 nm, and a distance between the side surface S1 and the side surface S2 is 820 nm.

FIG. 5 also illustrates an organic functional layer 15 and a common electrode 16 which are sequentially formed after the conductive layer 22 is formed. The organic functional layer 15 may include at least a light-emitting layer, without limited thereto. For example, the organic functional layer 15 may include at least one of a hole injection layer, a hole transport layer, an electron transport layer, and an electron injection layer in addition to the light-emitting layer.

Figure 6:
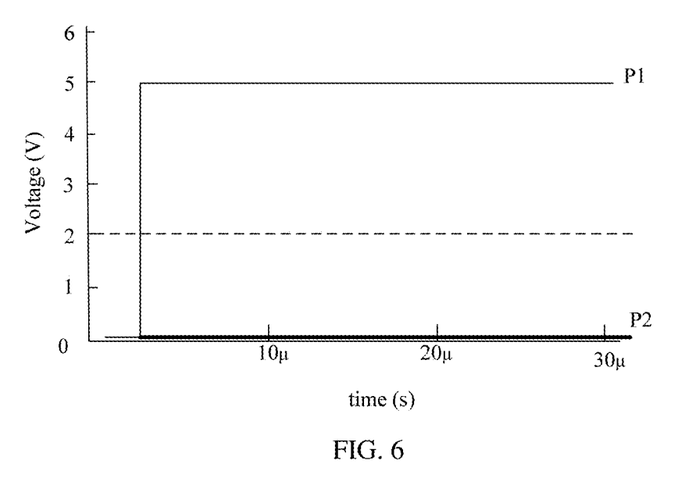
FIG. 6 is a schematic diagram illustrating a coupling voltage between adjacent pixels of a display substrate provided by one or more embodiments of the present disclosure.

FIG. 6 is a schematic diagram illustrating a coupling voltage between adjacent pixels of a display substrate provided by one or more embodiments of the present disclosure. For example, the display substrate of FIG. 6 may be the display substrate as illustrated in FIG. 5, without limited thereto. As illustrated in FIG. 6, a turn-on voltage of the pixel is 2V. When the pixel P1 is turned on, a coupling voltage of the pixel P2 adjacent to the pixel P1 is less than 2V and the pixel P2 is not turned on. Therefore, the arrangement of the conductive layer can alleviate the crosstalk. It should be noted that the turn-on voltage of the pixel may be other values. The display substrate is provided with the blocking part, which may prevent the pixel P1 which is inputted with the voltage signal from affecting the coupling voltage of the pixel P2 adjacent to the pixel P1. The coupling voltage of the pixel P2 is very small. When the pixel P1 is turned on, the coupling voltage of the pixel P2 is less than the turn-on voltage, the pixel P2 is not turned on due to the small coupling voltage, and the pixel P2 does not emit light. Thus, the crosstalk problem between adjacent pixels is eliminated.

Figure 7A:
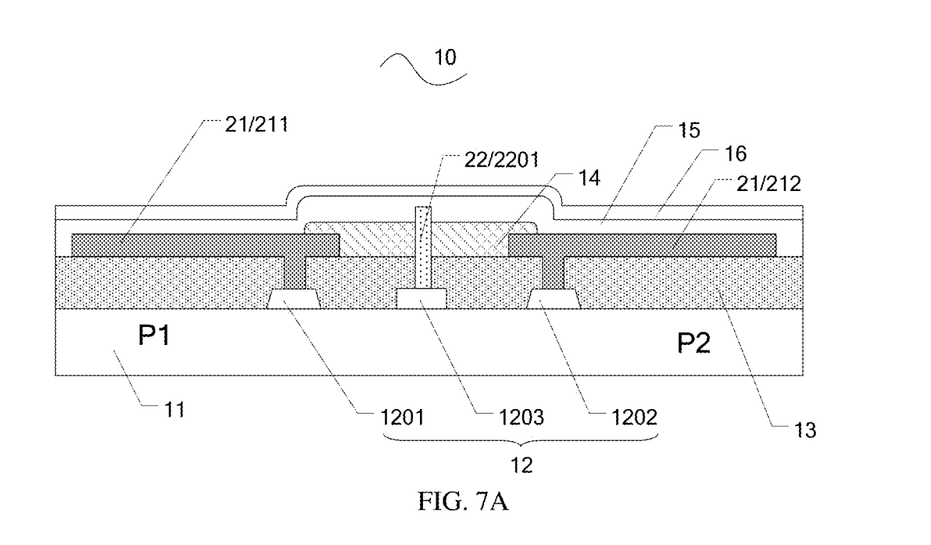
FIG. 7A-FIG. 7C are cross-sectional views illustrating a display substrate provided by one or more embodiments of the present disclosure.
Figure 7B:
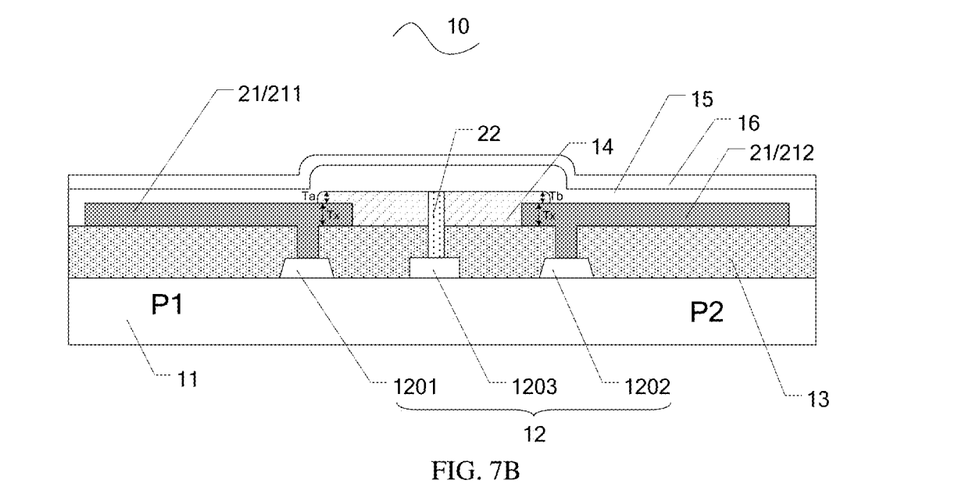
Figure 7C:
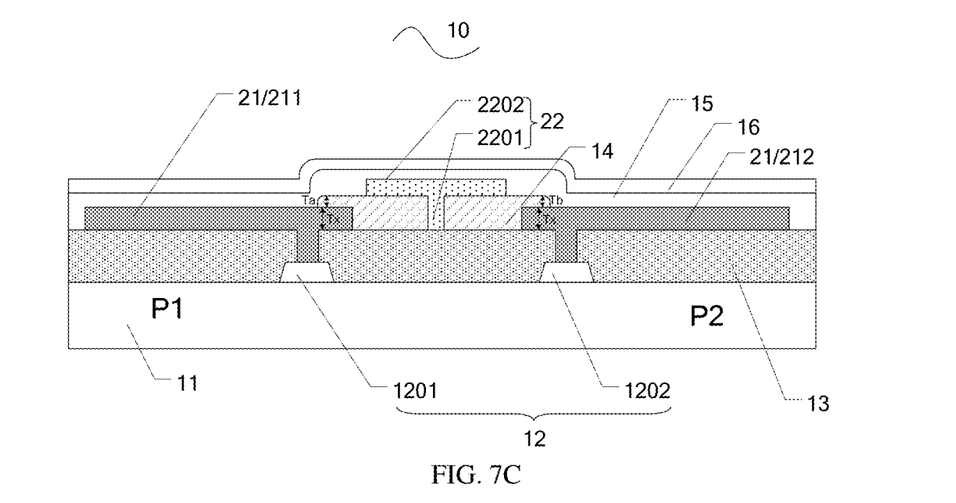

FIG. 7A-FIG. 7C are cross-sectional views illustrating a display substrate provided by one or more embodiments of the present disclosure. As illustrated in FIG. 7A, compared with the structure as illustrated in FIG. 5, the conductive layer 22 includes only the blocking part 2201, and the blocking part 2201 protrudes from the insulation material layer 14 in a direction away from the base substrate 11. As illustrated in FIG. 7B, compared with the structure as illustrated in FIG. 5, the conductive layer 22 includes only the blocking part 2201, and the blocking part 2201 does not protrude from the insulation material layer 14 in the direction away from the base substrate 11. For example, an upper surface of the blocking part 2201 is flush with an upper surface of the insulation material layer 14. As illustrated in FIG. 7C, compared with the structure as illustrated in FIG. 5, the conductive layer 22 does not run through the interlayer insulation layer 13. For example, as illustrated in FIG. 7C, the conductive layer 22 only runs through the insulation material layer 14. For example, the upper surface of the blocking part 2201 is a surface of the blocking part 2201 away from the base substrate, and the upper surface of the insulation material layer 14 is a surface of the insulation material layer 14 away from the base substrate.

Figure 8A:
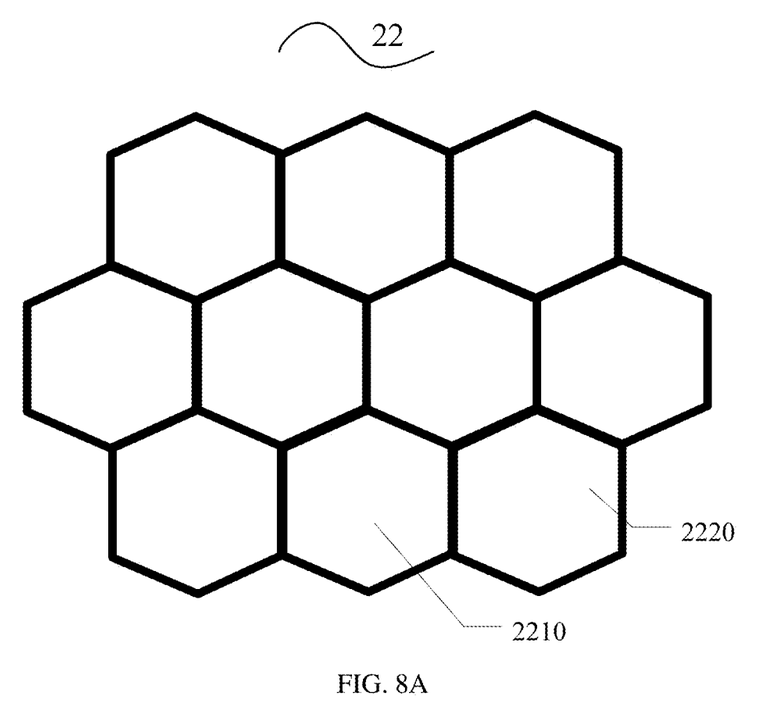
FIG. 8A is a schematic plan view illustrating a conductive layer of a display substrate provided by one or more embodiments of the present disclosure.

FIG. 8A is a schematic plan view illustrating a conductive layer of a display substrate provided by one or more embodiments of the present disclosure. As illustrated in FIG. 8A, the plan view of the conductive layer 22 may be similar to a honeycomb shape. FIG. 8A also illustrates the first hollowed-out part 2210 and the second hollowed-out part 2220.

Figure 8B:
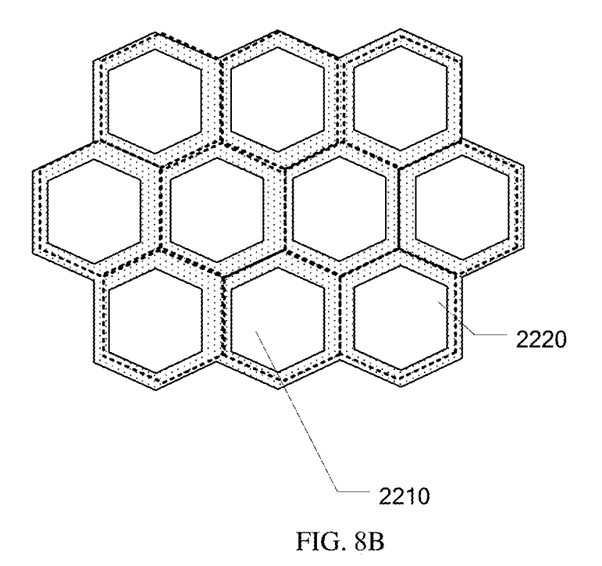
FIG. 8B is a schematic plan view illustrating a conductive layer of a display substrate provided by one or more embodiments of the present disclosure.

FIG. 8B is a schematic plan view illustrating a conductive layer of a display substrate provided by one or more embodiments of the present disclosure. With reference to FIG. 8B in combination with FIG. 4 and FIG. 5, the conductive layer 22 includes a first hollowed-out part 2210 and a second hollowed-out part 2220. Dotted lines of FIG. 8B are used to distinguish different pixels and are not an actual structure of the display substrate.

Figure 9:
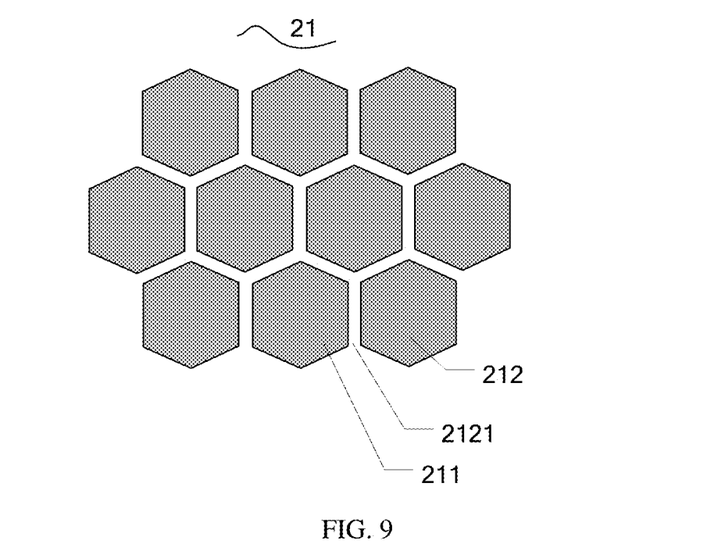
FIG. 9 is a schematic plan view illustrating an electrode layer of a display substrate provided by one or more embodiments of the present disclosure.

FIG. 9 is a schematic plan view illustrating an electrode layer 21 of a display substrate provided by one or more embodiments of the present disclosure. With reference to FIG. 9 in combination with FIG. 4 and FIG. 5, a gap 2121 is provided between the first electrode 211 and second electrode 212 that are adjacent to each other, and the conductive layer may be arranged at a position corresponding to the gap 2121. For example, an area of the orthographic projection of the conductive layer on the base substrate is less than an area of the orthographic projection of the gap 2121 on the base substrate.

Figure 10:
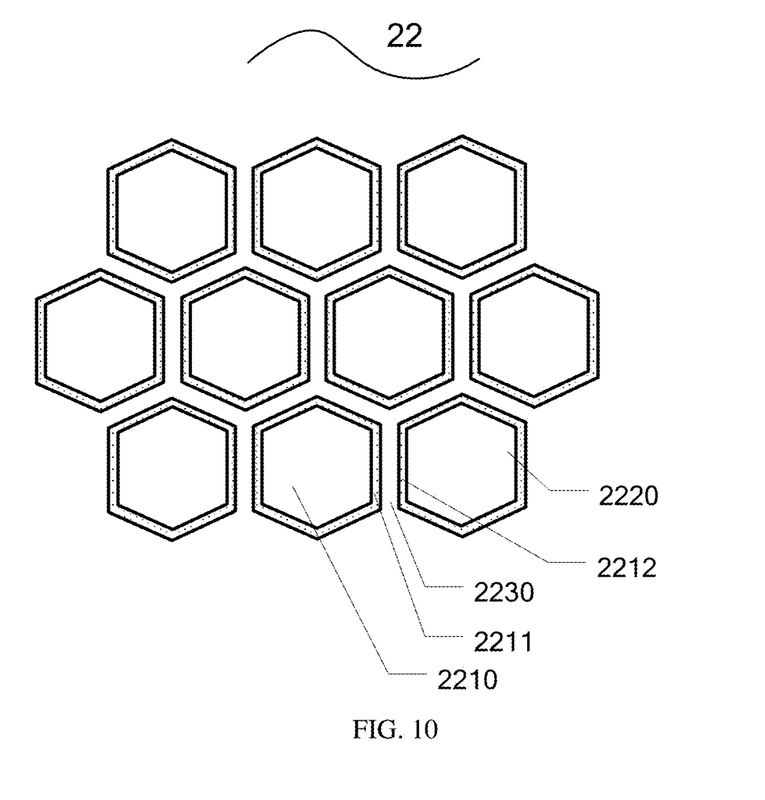
FIG. 10 is a schematic plan view illustrating a conductive layer of a display substrate provided by another embodiment of the present disclosure.

FIG. 10 is a schematic plan view illustrating a conductive layer 22 of a display substrate provided by another embodiment of the present disclosure. As illustrated in FIG. 10, compared with FIG. 8B, the conductive layer 22 may include a first conductive part 2211 and a second conductive part 2212 spaced apart from each other. A gap 2230 is provided between the first conductive part 2211 and the second conductive part 2212. For example, the first conductive part 2211 and the second conductive part 2212 may be respectively connected with different conductive wires to be grounded. For example, the first conductive part 2211 and the second conductive part 2212 may be connected with a same conductive wire to be grounded.

At least one embodiment of the present disclosure provides a manufacture method of a display substrate. Compared with a conventional method, the manufacture method provided by the embodiment of the present disclosure includes manufacturing a conductive layer. The conductive layer is any one of the above conductive layers. Detailed description is given below with reference to an embodiment.

In an embodiment, a manufacture method of a display substrate having the structure as illustrated in FIG. 5 includes following steps.

Step (1) includes forming a source-drain electrode layer 12 on a base substrate 11. The source-drain electrode layer 12 includes both a source electrode and a drain electrode of a thin film transistor (TFT). For example, the source-drain electrode layer includes a first drain electrode 1201, a first source electrode (not illustrated in figures), a second drain electrode 1202, a second source electrode (not illustrated in figures), and a conductive wire. The first drain electrode 1201 and the first source electrode are used to form a first TFT, and the second drain electrode 1202 and the second source electrode are used to form a second TFT.

Step (2) includes forming an interlayer insulation layer 13 on the source-drain electrode layer 12.

Step (3) includes forming an electrode layer 21 on the interlayer insulation layer 13. The electrode layer 21 includes a first electrode 211 and a second electrode 212. The first electrode 211 and the second electrode 212 are adjacent to each other and are insulated from each other. An orthographic projection of the second electrode 212 on the base substrate 11 is adjacent to an orthographic projection of the first electrode 211 on the base substrate 11.

Step (4) includes forming an insulation material layer 14. The insulation material layer 14 is located between the first electrode 211 and the second electrode 212 and is overlapped with the first electrode 211 and the second electrode 212 in the direction perpendicular to the base substrate 11, respectively.

Step (5) includes forming a via hole running through the insulation material layer 14. The via hole is located between the first electrode 211 and the second electrode 212.

Step (6) includes forming a conductive layer 22. The conductive layer 22 includes a blocking part 2201 located between opposite side surfaces S1 and S2 of the first electrode 211 and the second electrode 212, and the conductive layer 22 is electrically connected with the conductive wire 1203 by the via hole running through the insulation material layer 14, and the conductive wire 1203 is grounded so that the conductive layer 22 is grounded. The conductive layer 22 and the first electrode 211 are insulated from each other, and the conductive layer 22 and the second electrode 212 are insulated from each other, so that every two selected from the group consisting of the conductive layer 22, the first electrode 211, and the first electrode are insulated from each other.

Step (7) includes forming an organic functional layer 15 on the conductive layer 22.

Step (8) includes forming a common electrode 16 on the organic functional layer 15.

At least one embodiment of the present disclosure further provides a display device including any one of the above display substrates 10.

The display device may be a display device such as an OLED display device, and any products or components having a display function and including the display device, such as a television set, a digital camera, a cell phone, a watch, a tablet, a laptop, a navigator etc.

It should be noted that, for the purpose of clarity, in accompanying drawings for illustrating the embodiment(s) of the present disclosure, the thickness and size of a layer or a structure may be enlarged. However, it should be understood that, in the case where a component or element such as a layer, film, area, substrate or the like is referred to be "on" or "under" another component or element, it may be directly on or under the another component or element or a component or element is interposed therebetween.

In the embodiments of the present disclosure, the first element and the second element being adjacent to each other refers to that other first elements or other second elements are not provided between the first element and the second element. For example, a third element may be provided between the first element and the second element that are adjacent to each other, and the third element is an element different from the first and second elements.

In the embodiments of the present disclosure, a patterning or a patterning process may include only a photolithography process, or include a photolithography process and an etching process, or include other processes to form a predetermined pattern such as a printing process, and an inkjet process. A photolithography process includes forming a pattern by processes such as film forming, exposure, and development etc., by using photoresist, mask, exposure machine etc. A corresponding patterning process may be selected according to the structure formed by the embodiment of the present disclosure.

In case of no conflict, features in one embodiment or in different embodiments may be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A display substrate, comprising:
a base substrate;
a first electrode, located on the base substrate;
a second electrode, located on the base substrate, an orthographic projection of the second electrode on the base substrate being adjacent to an orthographic projection of the first electrode on the base substrate; and
a conductive layer, comprising a blocking part between opposite side surfaces of the first electrode and the second electrode, wherein the conductive layer is grounded, and every two selected from the group consisting of the first electrode, the second electrode, and the conductive layer are insulated from each other,
the display substrate further comprising an insulation material layer, wherein the insulation material layer is filled in a space between the opposite side surfaces of the first electrode and the second electrode, the blocking part runs through the insulation material layer, and the insulation material layer is in contact with the opposite side surfaces of the first electrode and the second electrode,
wherein the conductive layer is constituted by the blocking part, and the blocking part protrudes from the insulation material layer in a direction away from the base substrate.

2. A display substrate, comprising:
a base substrate;
a first electrode, located on the base substrate;
a second electrode, located on the base substrate, an orthographic projection of the second electrode on the base substrate being adjacent to an orthographic projection of the first electrode on the base substrate; and
a conductive layer, comprising a blocking part between opposite side surfaces of the first electrode and the second electrode, wherein the conductive layer is grounded, and every two selected from the group consisting of the first electrode, the second electrode, and the conductive layer are insulated from each other,
the display substrate further comprising an insulation material layer, wherein the insulation material layer is filled in a space between the opposite side surfaces of the first electrode and the second electrode, the blocking part runs through the insulation material layer, and the insulation material layer is in contact with the opposite side surfaces of the first electrode and the second electrode,
wherein the conductive layer is constituted by the blocking part, and a surface of the blocking part away from the base substrate is flush with a surface of the insulation material layer away from the base substrate.

3. A display substrate, comprising:
a base substrate;
a first electrode, located on the base substrate;
a second electrode, located on the base substrate, an orthographic projection of the second electrode on the base substrate being adjacent to an orthographic projection of the first electrode on the base substrate; and
a conductive layer, comprising a blocking part between opposite side surfaces of the first electrode and the second electrode, wherein the conductive layer is grounded, and every two selected from the group consisting of the first electrode, the second electrode, and the conductive layer are insulated from each other,
the display substrate further comprising an insulation material layer, wherein the insulation material layer is filled in a space between the opposite side surfaces of the first electrode and the second electrode, the blocking part runs through the insulation material layer, and the insulation material layer is in contact with the opposite side surfaces of the first electrode and the second electrode, wherein the conductive layer further comprises an intersected part that is intersected with the blocking part at a side of the insulation material layer away from the base substrate.

4. The display substrate according to claim 3, wherein an orthographic projection of the conductive layer on the base substrate is not overlapped with the orthographic projection of the first electrode on the base substrate and is not overlapped with the orthographic projection of the second electrode on the base substrate.

5. The display substrate according to claim 3, wherein an orthographic projection of the conductive layer on the base substrate surrounds both of the orthographic projection of the first electrode on the base substrate and the orthographic projection of the second electrode on the base substrate.

6. The display substrate according to claim 3, wherein the conductive layer comprises a first hollowed-out part and a second hollowed-out part which are adjacent to each other, and the orthographic projection of the first electrode on the base substrate is located within an orthographic projection of the first hollowed-out part on the base substrate, and the orthographic projection of the second electrode on the base substrate is located within an orthographic projection of the second hollowed-out part on the base substrate.

7. The display substrate according to claim 3, wherein the blocking part and the intersected part form a T-shaped structure.

8. The display substrate according to claim 3, wherein the blocking part and the intersected part constitute an integral structure.

9. The display substrate according to claim 3, further comprising an interlayer insulation layer, wherein the interlayer insulation layer is located at a side of the first electrode close to the base substrate, the first electrode comprises a first main part located at a side of the interlayer insulation layer away from the base substrate and a first connection part running through the interlayer insulation layer, and wherein the interlayer insulation layer is located at a side of the second electrode close to the base substrate, and the second electrode comprises a second main part at the side of the interlayer insulation layer away from the base substrate and a second connection part running through the interlayer insulation layer.

10. The display substrate according to claim 9, wherein a size of the first main part in a direction perpendicular to the base substrate is less than a size of the conductive layer in the direction perpendicular to the base substrate, and a size of the second main part in the direction perpendicular to the base substrate is less than a size of the conductive layer in the direction perpendicular to the base substrate.

11. The display substrate according to claim 9, wherein a size of the insulation material layer in a direction perpendicular to the base substrate is greater than a size of at least one of the first main part or the second main part in the direction perpendicular to the base substrate.

12. The display substrate according to claim 11, further comprising a source-drain electrode layer between the base substrate and the interlayer insulation layer, wherein the source-drain electrode layer comprises a first drain electrode electrically connected with the first connection part, a second drain electrode electrically connected with the second connection part, and a conductive wire electrically connected with the conductive layer, the blocking part further runs through the interlayer insulation layer and is electrically connected with the conductive wire, and the conductive layer is grounded by the conductive wire.

13. The display substrate according to claim 12, wherein every two selected from the group consisting of the first drain electrode, the second drain electrode, and the conductive wire are insulated from each other.

14. The display substrate according to claim 9, wherein a sum of a size of the first main part in a direction perpendicular to the base substrate and a size of the first connection part in a direction perpendicular to the base substrate is less than a sum of a size of the blocking part in the direction perpendicular to the base substrate and a size of the intersected part in the direction perpendicular to the base substrate, and a sum of a size of the second main part in a direction perpendicular to the base substrate and a size of the second connection part in a direction perpendicular to the base substrate is less than a sum of a size of the blocking part in the direction perpendicular to the base substrate and a size of the intersected part in the direction perpendicular to the base substrate.

15. The display substrate according to claim 3, wherein a material of the conductive layer comprises a light-shielding material.

16. The display substrate according to claim 3, wherein both of the first electrode and the second electrode are pixel electrodes.

17. The display substrate according to claim 3, wherein the first electrode and the second electrode are connected with the first drain electrode and the second drain electrode, respectively.

18. A display device comprising the display substrate according to claim 3.

19. The display substrate according to claim 3, wherein the blocking part is in contact with the intersected part that.

* * * * *